March 4, 1952 E. TOTH 2,587,667

INDUCTIVELY COUPLED COMPENSATOR

Filed June 14, 1945 2 SHEETS—SHEET 1

Inventor

EMERICK TOTH

By Ralph L. Chappell

Attorney

March 4, 1952 E. TOTH 2,587,667

INDUCTIVELY COUPLED COMPENSATOR

Filed June 14, 1945 2 SHEETS—SHEET 2

Inventor
ÉMERICK TOTH

By Ralph L Chappell
Attorney

Patented Mar. 4, 1952

2,587,667

UNITED STATES PATENT OFFICE 2,587,667

INDUCTIVELY COUPLED COMPENSATOR

Emerick Toth, Takoma Park, Md.

Application June 14, 1945, Serial No. 599,498

7 Claims. (Cl. 250—40)

(Granted under the act of March 3, 1883, as amended April 30, 1928; 370 O. G. 757)

This invention relates to means for coupling between heterodyne oscillators and converters and more particularly toward means for maintaining optimum oscillator voltage injection into the converter of an ultra-high-frequency receiver of the superheterodyne type, throughout the entire tuning range.

In receivers of the superheterodyne type it is well known to employ an oscillator, the electrical oscillations of which are coupled into a converter which mixes the oscillator frequency with the incoming signal, and produces a constant difference or intermediate frequency, which is passed on to the intermediate-frequency amplifier.

A commonly employed means for coupling oscillator and converter utilizes electro-magnetic induction between adjacent coils which form a part of the oscillator and converter tank circuits respectively. The oscillator circuit employed may be conventionally of either the Hartley or Colpitts types, while the converter may be of the grid-leak bias type.

In the grid-leak type of converter the plate voltage utilized is sufficiently small so that the grid conducts on the positive peaks of the impressed voltage oscillations; and, generally, the optimum conversion point results when the negative bias on the grid is slightly less than the peak oscillator voltage. Even without the application of oscillator voltage the grid is normally biased negatively due to the accumulation of electrons onto the grid from the space charge between the cathode and plate of the converter tube. This may be termed the "threshold bias". At the optimum conversion point grid conduction occurs on the positive peaks of the impressed oscillator voltage. When grid conduction occurs the grid acquires an additional negative bias automatically, as a result of the combined action of the grid capacitor and grid resistor. The total negative bias then is sufficient to just permit conduction on the positive peaks of the oscillator voltage. For example, it has been found that the oscillator voltage should somewhat exceed approximately ½ volts when applied to a type-955 converter tube in order to exceed the threshold voltage; and, preferably should be approximately from 1.0 to 2.0 volts to operate at the optimum conversion point.

In prior art devices of this class the oscillator voltage coupled into the converter stage has varied over the range of ultra-high-frequencies to which the receiver was responsive. This was due to two factors: (1) The oscillator develops less voltage at the low frequency end of the range than at the high frequency end of the range. In general this is caused by the variation in the tank circuit characteristics, particularly (L/C), and Q, over the aforesaid frequency range. (2) Since the signal frequency and oscillator frequencies differ by a smaller percentage at the high frequency end of the range the oscillator and converter tank circuits are more nearly in tune, and consequently energy transfer is more effective at the high frequency end of the range.

As above-mentioned there is a minimum peak oscillator voltage equal to the "threshold bias" appearing on the converter grid below which conversion efficiency is decreased. In the same way there appears to be a maximum peak oscillator voltage appearing on the converter grid beyond which, any further increase in peak oscillator voltages will result in excessive radiation.

It is thus desirable to maintain a constant oscillator voltage input into the converter, the oscillator voltage being maintained within an optimum operating range.

It is accordingly an object of this invention to provide for the injection of a substantially constant oscillator voltage onto the converter grid over a wide frequency range.

Another object of this invention is to provide means for supplying oscillator voltage to a converter so as to effect its operation under constant optimum conversion efficiency.

A further object of this invention is to provide a novel coupling system between oscillator and converter systems.

A still further object of this invention is to provide for an auxiliary or parallel compensating coupling means between oscillator and converter circuits to maintain constant injection of oscillator voltage into the converter over the entire frequency range of the receiver.

Another object of this invention is the injection into a converter of a constant oscillator voltage the magnitude of which is sufficiently small to avoid undesired radiation, yet sufficiently large to permit the peak oscillator voltage to exceed the threshold negative bias of the converter tube.

Still another object of the invention is to provide novel coupling means between two adjacent tank circuits to maintain a constant coupling between the said tank circuits, over an extended frequency range.

Other objects, features and advantages of the invention will become apparent from the following detailed description of a preferred embodiment thereof, taken in conjunction with accompanying drawings, in which:

Fig. 8 is a detail view, slightly enlarged, of the adjustable plug member.

Figures 1, 2, 3, 4:
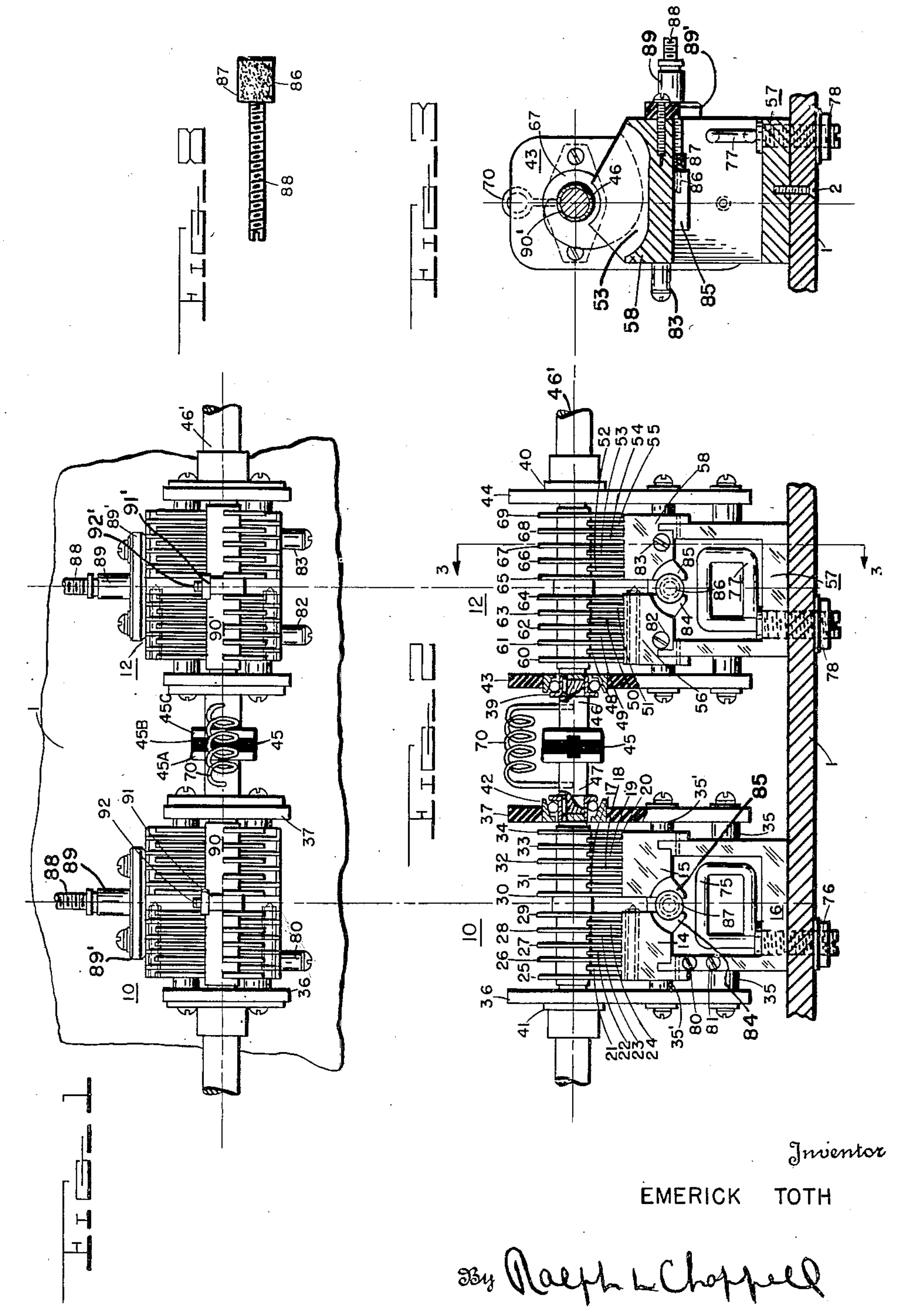
Fig. 1 is a top plan view showing a converter and oscillator tank circuit units constructed and coupled according to the principles of this invention.
Fig. 2 shows a side elevational view of the converter and oscillator units shown in Fig. 1 coupled according to this invention.
Fig. 3 represents a section taken substantially on the line 3—3 of Fig. 2.
Fig. 4 shows a schematic diagram of a superheterodyne receiver employing the improved oscillator and converter units which are constructed in accordance with this invention.
Figure 4:
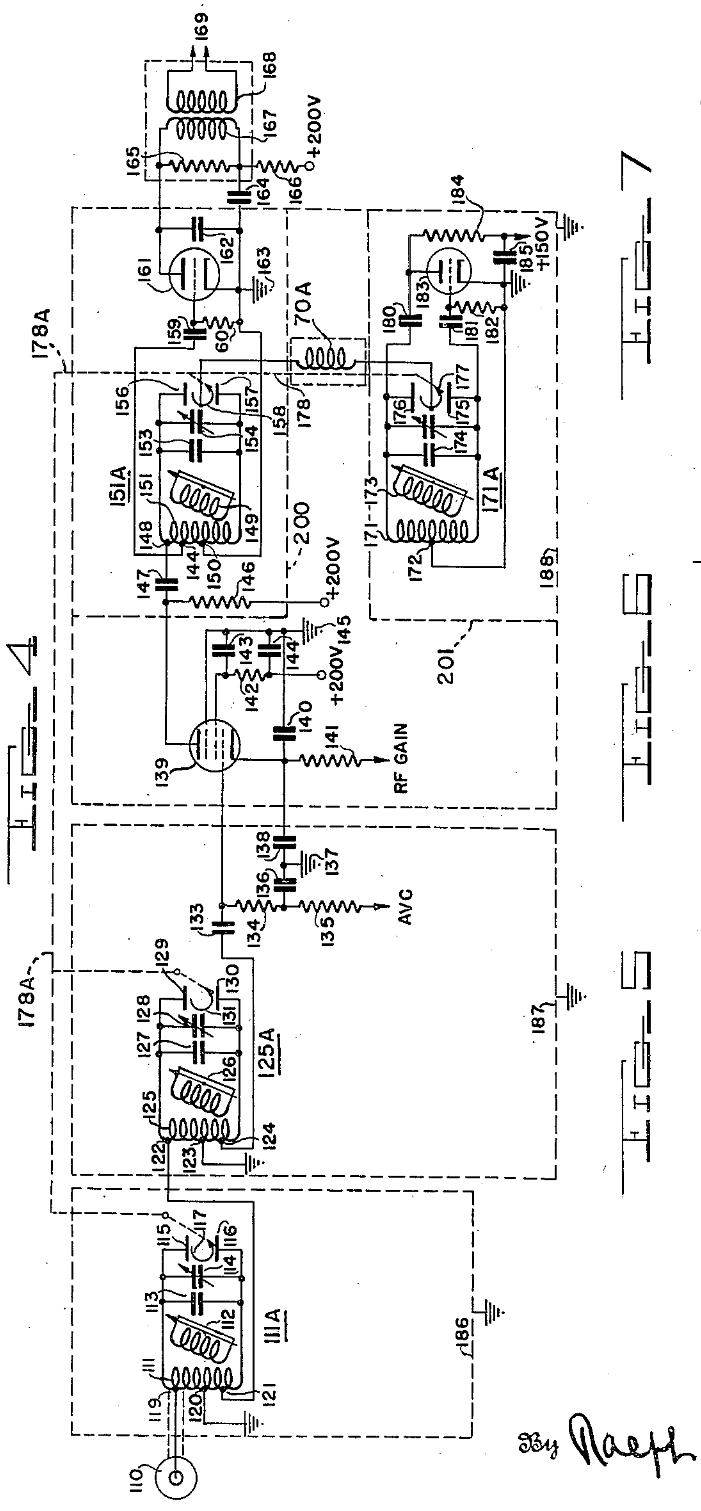

Referring more specifically to Figs. 1, 2 and 3 of the drawings, there is shown an ultra-high-frequency converter tank circuit 10 comprising a three-element capacitor and inductor arms 14 and 15 formed integral with tank inductor 16 of generally U-shaped formation. The stator portion of the capacitor unit 10 comprises two sets of stationary metal plate elements, viz., stationary plates 17, 18, 19 and 20 mounted on the end of inductor arm 15, and stationary plates 21, 22, 23 and 24, mounted on the end of inductor arm 14, respectively. End plates 36 and 37 of insulating material, secured in spaced relationship by means of insulating spacers 35, 35' and suitable bolts to the outer sides of the inductor arms 14 and 15, support anti-friction bearings 41 and 42, within which rotatable shaft 47 is free to rotate. Movable capacitor plate elements 25—34 are mounted on shaft 47 for rotation therewith. As thus arranged, the capacitor plate elements of the rotor are insulated from the fixed capacitor elements of the stator by the insulating end support members 36 and 37.

Unit 12 is the tank circuit of the ultra-high-frequency oscillator and is constructed similarly to unit 10 in that stationary capacitor plates 48, 49, 50, 51 are carried by the inductor arm 56 and stationary plates 52, 53, 54, 55 are carried by the inductor arm 58, respectively. Rotor shaft 46 is rotatably journaled in anti-friction bearings 39 and 40 which are mounted in spaced insulating support members 43 and 44, respectively. Mounted upon the rotatable shaft 46 are the movable metal plate elements 60—69 inclusive forming the capacitor rotor. The extended end of shaft 46 indicated as 46' may be turned by means of a suitable tuning dial (not shown) suitably secured thereto to control the angular positions of the rotor capacitor plate elements as well as indicate the frequency setting to which the receiver is tuned. The inner opposed ends of shafts 46 and 47 are mechanically interconnected, for example, by means of an Oldham type coupling 45 the intermediate member 45B of which may comprise an electrical insulating material, such as vulcanized rubber. As illustrated, the Oldham coupling consists of three members, viz., flange element 45A and 45C keyed to the respective shafts 47 and 46 and the central disc 45B which engages each of said flanges by a feather and groove forming a sliding pair in the event of any misalignment of shafts 46 and 47. These pairs of feathers and grooves are at right angles to each other so that motion can be transmitted from one shaft to the other, the three members forming this coupling thus have the same angular displacement for all positions.

In accordance with the arrangement above-described, the stationary capacitor plates 21—24 and 17—20, which are mounted on inductor arms 14 and 15 respectively, are supported on the ends of the U-member 16 which forms a single-turn inductance element associated with capacitor unit 10. Likewise, capacitor unit 12, including stationary capacitor plates 48—55, inductor arms 56 and 58 and U-member 57 is similarly constructed. Various points on each of the inductance elements 16 and 57 may be utilized as input and output terminals of the respective tank circuits and in one preferred embodiment of this invention the lower part of the inductance elements 16 and 57 is mounted upon the chassis or base 1 and suitably grounded thereto. This effectively grounds the midpoint of the inductance element which together with the associated capacitor elements comprises a tank circuit. Angular and axial positioning of the movable capacitor elements 25 to 34 inclusive of unit 10 with respect to the control shaft 47 is provided by mounting the group of capacitor plates upon sleeve 90 which is carried by shaft 47. The sleeve 90, which has a sliding fit on the shaft 47, is suitably secured to the shaft 47 as by means of a tightening screw 92 mounted in a tapped portion 91 of the sleeve. In this way there is provided means for adjustably positioning the movable capacitor plates relative to both the fixed capacitor plates of the respective stators 14 and 15 and to the shaft 47. The movable capacitor elements 60—69 of unit 12 are mounted upon the shaft 46 in a manner similar to the arrangement of unit 10, by means of sleeve 90', tapped portion 91' and tightening screw 92'.

The radio frequency input may be applied at terminal connector 80 of the converter tank unit 10, and the output to the grid of the converter may be taken from terminal connector 81 of the converter tank unit 10.

Similarly, the oscillator tube circuit may be connected to the oscillator tank unit 12 at terminals 82 and 83.

In addition to the mechanical coupling element 45 which gang-connects the movable capacitor plates of units 10 and 12, there is provided also an electrical equalizer "network," such as coiled inductor 70, which is in a stand-off relation and turns with the shafts 46 and 47 as well as being electrically connected to the ends thereof. The purpose of the inductance 70 will be described more fully hereinafter.

Mounted within the main U-shaped inductor 16 is a small single-turn metal loop 75 which may be rotatably positioned at various angles with respect to the inductance element 16 by means of the adjustment screw 76 formed integral with the loop 75, the loop 75 serves as a short-circuiting loop for the purpose of varying the inductance of the inductor 16. The adjusted position of loop 75 to which it is swung within inductor 16 is usually determined in the initial alignment of the unit 10 and is not subsequently disturbed in the ordinary operation of the receiver. For the purpose or adjusting the inductance of the U-shaped inductor 67 a movable single-turned loop 77 is similarly provided within the main inductor 67.

Referring to Fig. 3 a section of the oscillator tank unit 12 taken approximately on the line 3—3 of Fig. 2, is shown with the inductor 57 attached to the main chassis 1 in a suitable manner, such as by means of screws 2. The capacity of the oscillator tank unit 12 may be trimmed by adjusting screw 88. The turning of this screw advances or retracts a metal cylinder or plug 87 in the cylindrical bore formed between the concave opposed end faces of the flange members 84 and 85 extending from the underside of the separated inductor arms of the unit 12. The exterior of the plug 87 is provided with an insulating surface coating, such as a glass enamel 86 (see Fig. 8). Turning of adjusting screw 88 enables the capacity to be minutely varied by either withdrawal or insertion of varied amounts of metal forming the plug 87 between the extending flanges 84 and 85 of the respective inductor arms 56 and 58 which thus function as the plates of the trimming capacitor. Screw 88 turns within the outwardly projecting tapped metal sleeve 89 mounted upon the insulating support 89′ which, in turn, is attached by suitable screws to the adjacent side faces 56 and 58 of the separated inductor arms 56 and 58 of the unit 12. Similarly, converter unit 10 is provided with an adjustable slug type trimming capacitor, designated by corresponding reference numerals, in association with the inductor arms 14 and 15 and the inductor 16 thereof.

In Fig. 4, there is shown an ultra-high-frequency superheterodyne receiver constructed in accordance with the teachings of this invention. In this arrangement input coaxial line 110 leads to end terminal 119 on inductor 111 of tuning unit 111A, this unit being similar except for positions of the connections to the inductor 111 to the portion of Fig. 1 shown therein as unit 10. For purposes of clarifying the understanding of the operation of the system of Fig. 4 the schematic circuit diagram there represented shows the inductor 111 as comprising a coil having numerous turns which are appropriately tapped such as, for example, at 119 for the input from the coaxial cable 110 from the antenna, at the midpoint 120 to ground, and at 121 where the output is taken from the tuning unit 111A into the radio frequency amplifier within its shielded box 187. The angular position of inductor 112, which corresponds to loop 75 of Fig. 2, with respect to inductor 111 may be varied to align the tuned circuit. In tuning unit 111A the three-element capacitor there indicated comprises a movable set of capacitor plate elements 117 insulated from the fixed capacitor plate elements 115 and 116. The capacitance may be varied, between the fixed plate elements of the three-element capacitor, by relative motion of the rotor plates 117 with respect to the fixed or stator capacitor elements 115 and 116. Shunted across the fixed elements 115 and 116 is a fixed capacitor 113 which represents the distributed capacity of the inductor 111, plus an added loading capacitor, and also in shunt with the fixed elements 115 and 116 is a second capacitor 114 which serves as a trimmer capacitor and corresponds to the adjustable plug 87 of Fig. 2.

The tank circuit unit 125A of the radio frequency amplifier within shielded box 187 is of similar construction to that previously described in connection with the tank unit 111A within shielded box 186. The output of inductor 125 is removed at tap 124 and the radio frequency energy is fed through coupling capacitor 133 to the control grid of the radio frequency amplifier pentode 139 which may comprise, for example, a type-956 tube. Voltage for automatic volume control purposes is introduced through a filter network formed by resistors 134 and 135 and capacitor 136, and the radio frequency gain is controlled through the introduction of a suitable voltage through a filter network consisting of capacitors 138, 140 and resistor 141. Screen and suppressor grids of tube 139 are connected as shown, in the conventional manner. Plate voltage (+200 volts) is supplied through resistor 146 and the radio frequency voltage is passed through capacitor 147 into the end tap 148 on inductor 151 of converter tank circuit 151A. It is to be again understood that the inductor 151, which is shown for the sake of clarity of illustration as a multiple-turn coil, actually may comprise but a single turn loop, and that the invention is not limited to inductors of any specific number of turns, but the practical embodiment shown in Figs. 1–3 inclusive is the preferred construction.

Continuing further with the description of Fig. 4 the oscillator inductor 171 of the oscillator tank circuit 171A, there shown, which is representative of inductor 57 (see Fig. 2) and included in the tank circuit 12, is grounded at its midtap 172, and the outer terminals of inductor 171 are connected through coupling capacitors 180 and 181 to the plate and grid terminals, respectively, of the oscillator tube 183 which may, for example, comprise a type-955 tube. The control grid of tube 183 is connected through grid resistor 182 to ground. Plate voltage (+150 volts) is supplied through resistor 184 and capacitor 185 which bypasses the radio frequency to ground preventing the latter from entering the power system. Inductor loop 173 may be rotated to adjust the inductance of the inductor 17. The oscillator three-element-capacitor unit comprises fixed stator plates 175 and 176 and movable plate element 177. The movable plate element 177 is mechanically coupled to the movable plate element 158 of the three-element-capacitor unit included in the converter tank circuit 151A, by an Oldham or other type insulated coupling, such as 45 shown in Figs. 1 and 2, and indicated schematically in Fig. 4 by the broken interconnecting lines 178. Movable plate elements 177 and 158, in addition to the mechanical coupling 178, are electrically coupled through an impedance 70A which preferably may comprise the coiled inductor 70 such as shown in Figs. 1 and 2. It is also within the purview of this invention to employ other equalizing electrical networks than the impedance 70A, if desired, as will be apparent from the foregoing description. The oscillator tank circuit shown in Fig. 4 is inductively coupled through the proximity of inductor 171 of the oscillator tank circuit 171A to the inductor 151 in the converter tank circuit 151A. The transfer of electromagnetic energy through the space between inductors 171 and 151 is most effective at the higher frequencies, since the two tank circuits differ in their resonant frequencies by a small percentage of the average frequency of the two tank circuits. Also, at the upper end of the range the Q value of the oscillator tank circuit is greater and consequently a higher voltage is generated thereby transferring a greater voltage through space by induction to the converter tank circuit.

To compensate for the lower voltage delivered by the oscillator to the converter a separate path, through impedance 70A, is provided in shunt with the mutual inductance path. The compensating action of this electrical path through impedance 70A will be evident upon consideration of the operation of the receiver at the low frequency end of its operating range, where the tank circuits contain their greatest capacity. Under the latter condition the movable plates 158 and 177 are enmeshed to the greatest extent between their fixed stator capacitor elements 156, 157 and 175, 176, respectively, and therefore the net capacitative coupling between the two tank units is thereby increased. Also the value of the impedance 70A is reduced at lower frequency. The results of these two effects is to increase the coupling along the path through impedance 70A between the converter and the oscillator stages. The value of the impedance 70A may be selected as to substantially compensate for reduced electromagnetic coupling and reduced oscillator voltage output at lower frequencies.

It is to be understood that the above illustration is not limiting but that the principle of an equalizer network in shunt with electromagnetic coupling through the space between two tank circuits may take on other forms and yet come within the purview of this invention.

The oscillator circuit shown in Fig. 4 is of the Hartley type and the converter there shown is of the grid-leak bias type. It is also to be understood that these circuits are purely illustrative of the principles employed and are not to be considered limiting. The grid-leak bias type converter shown herewith is of a well known conventional type and need not be further described in detail. The intermediate frequency is transmitted from the primary 167 of the intermediate-frequency transformer to the secondary 168 thereof from which the intermediate-frequency line 169 leads to the intermediate-frequency amplifier (not shown).

It will be noted that the elements comprising the various tank circuits are ganged-connected, as indicated by broken lines 178A, so that unicontrol of these circuits is achieved. Thus, there is provided a novel and efficient superheterodyne receiver for reception in the ultra-high frequency range, which possesses a stability and constancy of operation and which radiates a minimum of energy.

Figure 5:
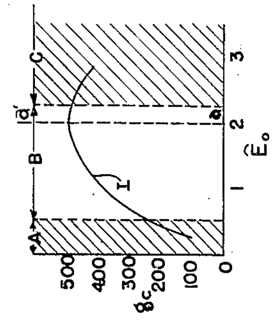
Fig. 5 shows the relation between the conversion transconductance of the converter tube and the peak oscillator voltage on the grid of the converter tube.

Turning to Fig. 5, there is shown curve I which represents the transconductance $g_c$ in micromhos of a converter tube plotted against the peak oscillator voltage $\hat{E}_o$ on the grid of the tube.

The conversion transconductance $g_c$ is defined as the ratio of the magnitude of the intermediate-frequency beat component $f_r—f_o$ of the output current to the magnitude of the input voltage of radio frequency $f_r$, measured under the condition that all direct voltages and the magnitude of the input voltage at the oscillator frequency $f_o$ are constant.

In Fig. 5 is illustrated a threshold voltage region A in which the conversion transconductance is small. In the particular case of a type-955 tube the threshold voltage is approximately minus one half volt (—0.5 volt). The region denoted by the letter C represents relatively large peak oscillator voltages which result in excessive radiation. Between the two regions A and C is an optimum operating range which is herein denoted by the letter B from ½ to approximately 2.25 volts. In certain cases, the conversion transconductance curve is found to reach a maximum within the optimum operating region B.

In Fig. 5 the line *aa'* indicates a quantity called the maximum conversion transconductance which in that curve corresponds to approximately two volts peak oscillator voltage. It is desirable not only to obtain maximum conversion transconductance in order to obtain the largest possible intermediate frequency output from a given radio frequency signal input but also to maintain this maximum response throughout the entire frequency range. It will be understood that the curve I of Fig. 5 is purely illustrative and approximates conditions obtained when a type-955 tube is utilized as a converter tube in a grid-leak type converter circuit in which the plate voltage is maintained at approximately 30 volts relative to the cathode. Under these conditions the tube and circuit act as a diode-biased amplifier. A grid-leak type of converter circuit is utilized herein as the preferred form since it operates well on low input voltages.

Figure 6:
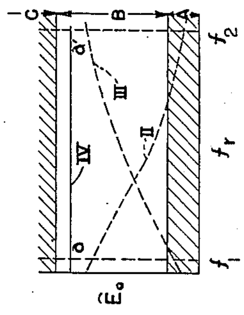
Fig. 6 shows the relation between the peak oscillator voltage and signal frequency, and illustrates the equalizer principle.

In Fig. 6, there are shown curves II, III and IV depicting peak oscillator voltage $\hat{E}_o$ plotted versus the frequency of the input radio frequency signal $f_r$. Thus, curve IV shows peak oscillator voltage $\hat{E}_o$ ideally maintained at the maximum conversion transconductance corresponding to *aa'* throughout the entire frequency range. Curve III shows the variation in peak oscillator voltage throughout the frequency range of the receiver as obtained without the use of an equalizer network between the converter and the oscillator. Curve II shows the characteristics of the equalizer network required to produce with curve III the resultant curve IV. Regions A, B, and C each have the same meaning above stated in connection with Fig. 5.

Figure 7:
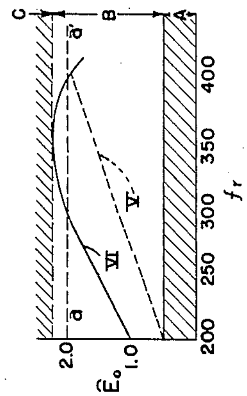
Fig. 7 shows experimental results obtained with a certain superheterodyne receiver constructed in accordance with one embodiment of this invention.

In Fig. 7 there are shown two curves depicting peak oscillator voltage $\hat{E}_o$ plotted versus the frequency $f_r$ to which the receiver is tuned, showing results experimentally obtained in a certain superheterodyne receiver constructed in accordance with a specific embodiment of this invention. Curve V shows results obtained utilizing as the only coupling, that of mutual induction through the space between the tank circuits of the oscillator and the converter. It will be noted that particularly at low frequencies the conversion transconductrance of the converter tube is low and consequently the converter is operating inefficiently. In Fig. 7 the line *aa'* as in both preceding figures again represents maximum conversion transconductance. The curve VI shown in Fig. 7 represents results obtained with a simple inductor coupling coil between the floating capacitor elements of the tube tank circuits, the tank circuits in addition are electromagnetically coupled through the intervening space. It will be noted that the variation in transconductance is reduced since the range of variation of curve VI is such as to cause a predominant operation within a substantially flat region of the transconductance curve shown in Fig. 5. It will be also noted that the operation occurs at or in the neighborhood of the maximum transconductance. It will be understood that other types of equalizer coupling means which are operable to cause the curve VI to move closely approximate the proximity to the line *aa'*, may be employed in place of the herein illustrated inductor coil 70 of Figs. 1 to 3 and impedance 70A of Fig. 4.

By way of example, typical values of the components employed in the oscillator and converter tank circuits may be as follows: The inductors 151 and 171 may have approximately .03 microhenries. The three-element capacitor units may have a minimum capacity of approximately 2 micromicrofarads and a maximum capacity of approximately 43 micromicrofarads. In addition, the stray capacity associated with the components connected to the tank circuits herein described may be of the order of 12 micromicrofarads. These values are intended to be illustrative only and are not to be considered as limiting in any way.

Equalizer networks are known in the prior art capable of maintaining a source of energy at constant power level over a range of frequencies. A reference in this connection is "Communication Engineering" by Everitt, 2nd edition, McGraw-Hill Book Company, 1937, pages 283 to 300 inclusive. Certain general theorems are therein given which enable the construction of equalizer networks to compensate for known variations throughout a frequency range.

It is within the purview of this invention to apply any such general type equalizer network between the floating capacitor elements of two tank circuits substantially in the arrangement described in this specification in lieu of the coil inductor 70 or impedance 70A.

In certain embodiments of this invention, for example, as shown in Fig. 4, the tank circuit is grounded at the midpoint, and the equalizing network is coupled off from the electrically floating plate elements of the capacitor unit which comprises a part of the tank circuit. It may seem that no power could be coupled through the floating element since it may appear that the floating element is at the potential of the midpoint, which is grounded. However, an unbalance is actually introduced into this system by the tube elements coupled to each side of the tank circuit which thus introduces a different impedance on each side of the tank circuit. The unbalance so produced at the floating electrical capacitor element with reference to ground permits a transfer of energy through the floating elements and their associated coupling circuit.

It is also contemplated to dispense with the electromagnetic coupling through the space between the oscillator and the converter tank units, and to provide instead a suitable coupling network between the floating capacitor elements of the oscillator and converter tank units as the only path between the aforesaid tank circuits. This may be accomplished by suitably shielding one tank circuit from the other by shields 200 and 201 shown in Fig. 4 for example, and by including the coupling network between the two floating capacitor elements substantially in the manner described in this specification. However, in order to obtain adequate power transfer between the oscillator and the converter it may be necessary to introduce a certain additional unbalance between the floating element and ground. This may readily be accomplished by reducing the impedance between one end of the tank circuit and the floating electrical capacitor element to ground by any known means, as for example, varying the value of one or the other capacitors which act to couple the tank circuit to the tube elements. In this case, since the electromagnetic space coupling path is not employed to supplement the network coupling path, the network coupling path should have a characteristic which compensates for the variation in voltage across the oscillator tank circuit throughout the frequency range.

While the invention has been described in connection with a particular embodiment, certain variations have been suggested and it is to be understood that many additional changes are possible within the scope of the invention.

The invention described herein may be manufactured and used by or for the Government of the United States of America for governmental purposes without the payment of any royalties thereon or therefor.

What is claimed is:

1. In combination, two capacitor units each comprising three sets of capacitor plate elements, one of said sets being movable and the remaining two sets being fixed, the area of the said movable sets being such as to be capable of introduction in variable amounts in interleaving relationship between the two fixed elements of each unit, capacitive means providing a mechanical insulating coupling between said movable set of plate elements of the two capacitor units, and impedance means electrically coupling said movable sets of plate elements to each other, the said movable sets of plate elements floating electrically between said fixed set of plate elements.

2. In combination, two capacitor units, each of said units comprising three sets of capacitor plate elements, one of said sets being movable and the remaining two sets being fixed, the area of the said movable sets being such as to be capable of introduction in variable amounts in interleaving relationship with respect to the two fixed sets of each unit, capacitive means providing a mechanical insulating coupling between said movable sets of plate elements of the said capacitor units, and inductor means electrically coupling said movable sets of plate elements to each other, the said movable sets of plate elements floating electrically between said fixed sets of plate elements.

3. In combination, two capacitor units each comprising three sets of capacitor plate elements, one of said sets being movable and the remaining sets being fixed, the area of the said movable sets being such as to be capable of introduction in variable amounts in interleaving relationship with respect to associated fixed sets of each unit, capacitive means providing a mechanical insulating coupling between said movable sets of plate elements of the said capacitor units, impedance means electrically coupling said movable sets of plate elements to each other, said movable sets of plate elements floating electrically between said fixed sets of elements, an inductor connected to each of said capacitor units to form a pair of tank circuits, and means electrically shielding said tank circuits from each other.

4. In combination, two capacitor units, each comprising three sets of capacitor plate elements, one of said sets being movable and the remaining two sets being fixed, the area of the said movable sets being such as to be capable of introduction in variable amounts in interleaving relationship with respect to the two fixed sets of each unit, capacitive means providing a mechanical insulating coupling between said movable sets of plate elements of said capacitor units, equalizer impedance means electrically coupling said movable sets of plate elements to each other, each of said movable sets of plate elements floating electrically between said associated pair of fixed sets of plate elements, an inductor associated with each of said capacitor units, said capacitor units mounted integrally with said associated inductors to form a pair of tank circuits which are electromagnetically coupled through the intervening space and means producing an electrical impedance unbalance at the said movable sets of elements with reference to ground.

5. In combination, two capacitor units, each comprising three sets of capacitor plate elements, one of said sets being movable and the remaining two sets being fixed, the area of the said movable sets being such as to be capable of introduction in variable amounts in interleaving relationship with respect to the two fixed sets of each unit, capacitive means providing a mechanical insulating coupling between said movable sets of plate elements of said capacitor units, equalizer impedance means electrically coupling said movable sets of plate elements to each other, said movable sets of plate elements floating electrically between said associated pair of fixed sets of plate elements, an inductor associated with each of said capacitor units, said capacitor units mounted integrally with said associated inductors to form a pair of tank circuits, means electrically shielding said tank circuits from each other, and means producing an electrical impedance unbalance at said movable sets of plate elements with reference to ground.

6. In combination, a pair of tuned circuits, each of said circuits including an inductance and a capacitance unit, each of said capacitance units comprising three sets of capacitor plate elements, one of said sets of each of said units being movable and the remaining two associated sets being fixed, the area of each of said movable sets being such as to be capable of introduction in variable amounts in interleaving relationship between said two associated fixed sets, capacitive means providing a mechanical insulating coupling between said movable sets of plate elements, and inductor means electrically coupling said movable sets of plate elements to each other, each of said movable sets of plate elements floating electrically between said two associated fixed sets.

7. In combination, a converter circuit, an oscillator circuit, each of said circuits including an inductance and a capacitance unit, each of said capacitance units comprising three sets of capacitor plate elements, one of said sets of each of said units being movable and the remaining two associated sets being fixed, the area of each of said movable sets being such as to be capable of introduction in variable amounts in interleaving relationship between said two associated fixed sets, capacitive means mechanically coupling said movable sets of plate elements together so as to revolve in unison, and inductor means electrically coupling said movable sets of plate elements to each other, each of said movable sets of plate elements floating electrically between said two associated fixed sets.

EMERICK TOTH.

REFERENCES CITED

The following references are of record in the file of this patent:

UNITED STATES PATENTS

| Number | Name | Date |
|---|---|---|
| 1,938,334 | Hoffman | Dec. 5, 1933 |
| 1,955,093 | Roosenstein | Apr. 17, 1934 |
| 2,001,694 | Farnham | May 14, 1935 |
| 2,159,782 | Conklin et al. | May 23, 1939 |
| 2,194,696 | Eickemeyer et al. | Mar. 26, 1940 |
| 2,244,807 | Schrumpf | June 10, 1941 |
| 2,266,670 | Winfield | Dec. 16, 1941 |
| 2,341,345 | Van Billiard | Feb. 8, 1944 |
| 2,384,504 | Thias | Sept. 11, 1945 |
| 2,404,669 | Tillman | July 23, 1946 |
| 2,408,895 | Turner | Oct. 8, 1946 |
| 2,422,454 | Weiss | June 17, 1947 |
| 2,453,489 | Bruntil | Nov. 9, 1948 |

FOREIGN PATENTS

| Number | Country | Date |
|---|---|---|
| 405,175 | Great Britain | Feb. 1, 1934 |